(12) United States Patent
Seta et al.

(10) Patent No.: US 8,269,346 B2
(45) Date of Patent: Sep. 18, 2012

(54) SEMICONDUCTOR DEVICE AND METHOD OF DESIGNING A WIRING OF A SEMICONDUCTOR DEVICE

(75) Inventors: Shoji Seta, Tokyo (JP); Hideaki Ikuma, Kanagawa-Ken (JP); Yukihito Oowaki, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/047,057

(22) Filed: Mar. 14, 2011

(65) Prior Publication Data

US 2012/0025377 A1    Feb. 2, 2012

(30) Foreign Application Priority Data

Jul. 28, 2010   (JP) ................................. 2010-169431

(51) Int. Cl.
*H01L 23/48* (2006.01)

(52) U.S. Cl. . 257/737; 257/738; 257/700; 257/E23.021; 257/E23.069; 257/E21.508; 438/613; 438/614; 438/615; 438/616; 438/617

(58) Field of Classification Search .................. 257/737, 257/738, 700, E23.021, E23.069, E21.508; 438/613–617

See application file for complete search history.

(56) References Cited

U.S. PATENT DOCUMENTS

| | | | | |
|---|---|---|---|---|
| 5,861,664 | A * | 1/1999 | Inoue ............................ | 257/697 |
| 5,936,843 | A * | 8/1999 | Ohshima et al. .............. | 361/760 |
| 6,022,757 | A * | 2/2000 | Andoh .......................... | 438/106 |
| 6,400,034 | B1 * | 6/2002 | Kimura et al. ................ | 257/778 |
| 6,656,826 | B2 * | 12/2003 | Ishimaru ....................... | 438/612 |
| 6,841,886 | B2 * | 1/2005 | Nakata et al. ................. | 257/778 |
| 6,887,778 | B2 * | 5/2005 | Watanabe et al. ............. | 438/613 |
| 6,914,259 | B2 * | 7/2005 | Sakiyama et al. ............. | 257/48 |
| 7,345,246 | B2 * | 3/2008 | Muramatsu et al. .......... | 174/260 |
| 7,402,461 | B2 * | 7/2008 | Mizukoshi et al. ........... | 438/108 |
| 7,476,968 | B2 * | 1/2009 | Shindo .......................... | 257/737 |
| 7,956,454 | B2 * | 6/2011 | Yamamoto et al. ........... | 257/700 |
| 2003/0032218 | A1 * | 2/2003 | Kado et al. .................... | 438/111 |

FOREIGN PATENT DOCUMENTS

| | | |
|---|---|---|
| JP | 2004-165189 | 6/2004 |
| JP | 2005-159199 | 6/2005 |

\* cited by examiner

*Primary Examiner* — Marcos D. Pizarro
*Assistant Examiner* — Bilkis Jahan
(74) *Attorney, Agent, or Firm* — Sprinkle IP Law Group

(57) ABSTRACT

A semiconductor device has an LSI chip including a semiconductor substrate, an LSI core section provided at a center portion of the semiconductor substrate and serving as a multilayered wiring layer of the semiconductor substrate, a first rewiring layer provided adjacent to an outer periphery of the LSI core section on the semiconductor substrate and including a plurality of wiring layers, a first pad electrode disposed at an outer periphery of the first rewiring layer, and an insulation layer covering the first pad electrode. The semiconductor device includes a second rewiring layer provided on the LSI chip and including a rewiring connected to the first pad electrode. The semiconductor device includes a plurality of ball electrodes provided on the second rewiring layer. The first rewiring layer is electrically connected to the LSI core section and the first pad electrode.

12 Claims, 13 Drawing Sheets

SEMICONDUCTOR DEVICE AND METHOD OF DESIGNING A WIRING OF A SEMICONDUCTOR DEVICE

CROSS-REFERENCE TO RELATED APPLICATION

This application is based upon and claims the benefit of priority from the prior Japanese Patent Application No. 2010-169431, filed on Jul. 28, 2010, the entire contents of which are incorporated herein by reference.

BACKGROUND

1. Field

Embodiments described herein relate generally to a semiconductor device and method of designing a wiring of a semiconductor device adapted to WSCP (Wafer level Chip Size Package).

2. Background Art

In WSCP, a rewiring pattern is generally formed in one layer, so it is significantly difficult to design a wiring pattern as compared with a multilayered substrate such as a ball grid array (BGA).

For this reason, according to the layout of pads, there exist a signal line, a power supply, and a ground line that may not be connected. As a result, it becomes difficult to manufacture an LSI.

Specifically, when implementing a hard macro, the positions of pads are fixed, and the positions of the pads may not be arbitrarily changed. Thus, it is difficult to design a rewiring pattern.

Therefore, under such circumstances, reconsideration or the like for the layout is necessary. This not only delays the schedule of a product development but also lowers the performance of the hard macro.

DETAILED DESCRIPTION

A semiconductor device according to an embodiment, includes an LSI chip including a semiconductor substrate, an LSI core section provided at a center portion of the semiconductor substrate and serving as a multilayered wiring layer of the semiconductor substrate, a first rewiring layer provided adjacent to an outer periphery of the LSI core section on the semiconductor substrate and including a plurality of wiring layers, a first pad electrode disposed at an outer periphery of the first rewiring layer, and an insulation layer covering the first pad electrode. The semiconductor device includes a second rewiring layer provided on the LSI chip and including a rewiring connected to the first pad electrode. The semiconductor device includes a plurality of ball electrodes provided on the second rewiring layer. The first rewiring layer is electrically connected to the LSI core section and the first pad electrode.

Hereinafter, each embodiment will be described in more detail with reference to the drawings.

First Embodiment

Figure 1:
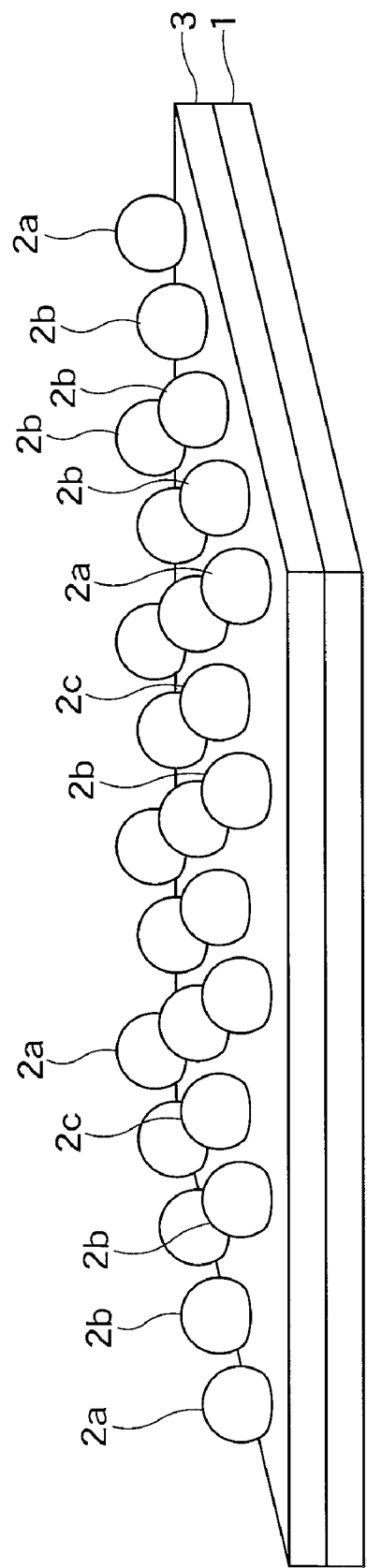
FIG. 1 is a diagram illustrating an example of the configuration of a semiconductor device 100 according to a first embodiment.
Figure 2:
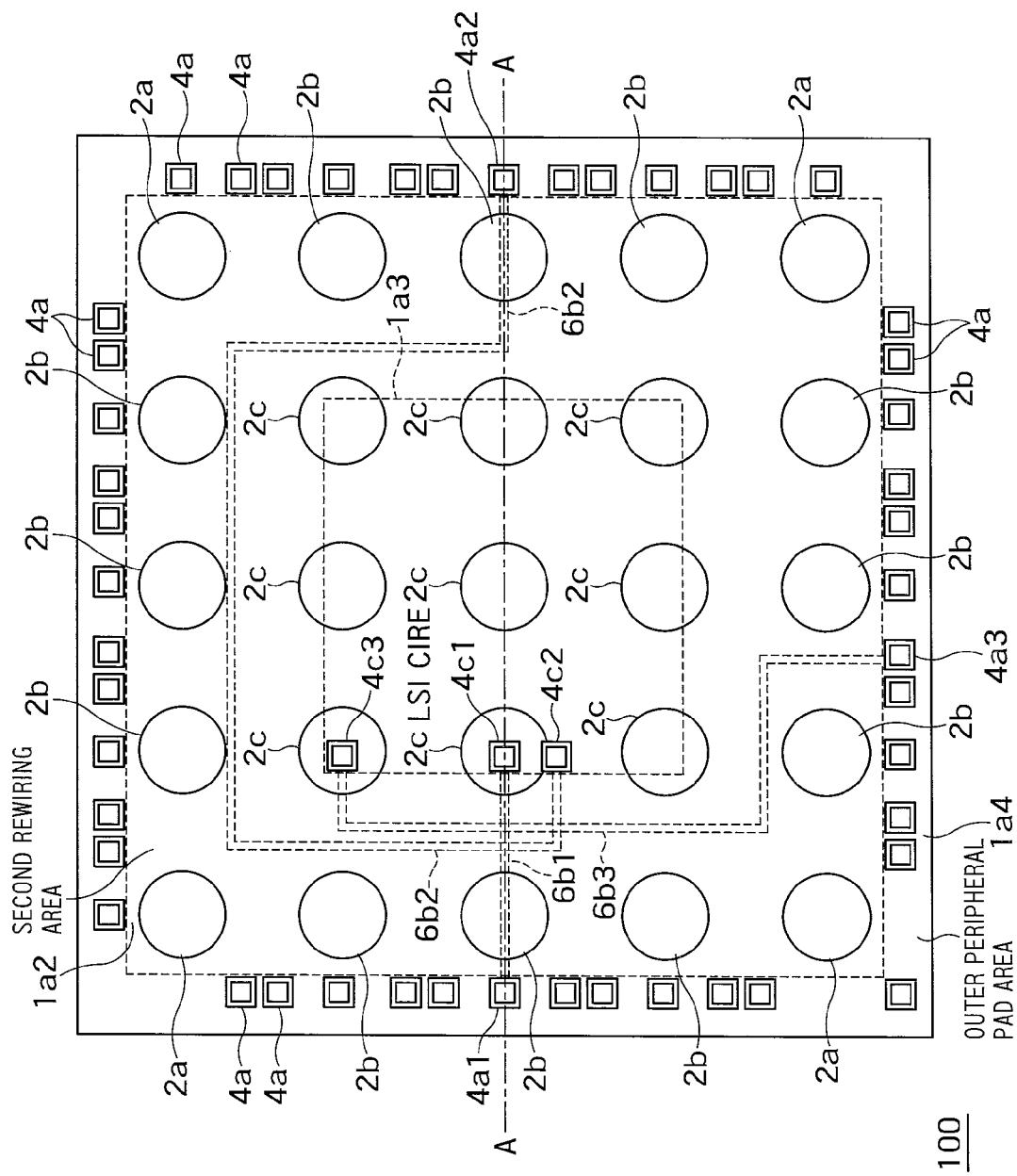
FIG. 2 is a top plan view illustrating an example of the semiconductor device 100 illustrated in FIG. 1 when viewed from the top thereof.
Figure 3:
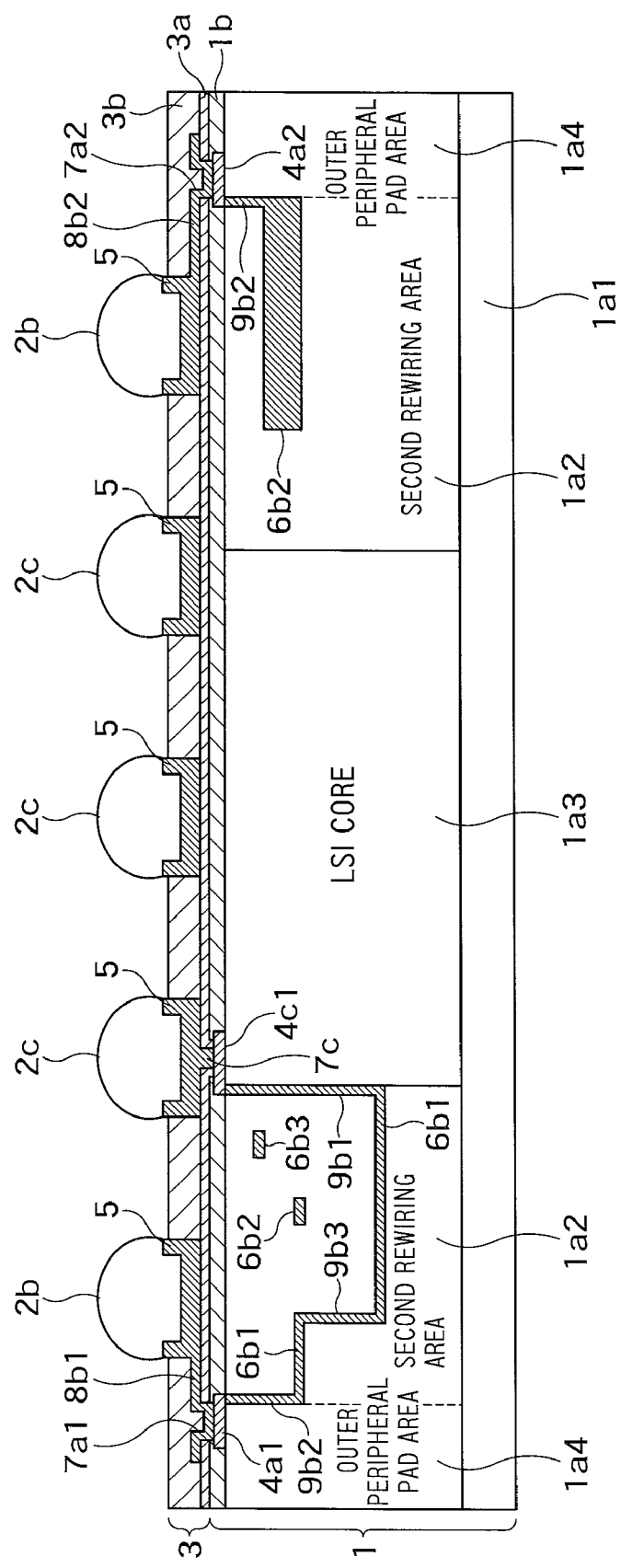
FIG. 3 is a sectional view illustrating an example of the section of the semiconductor device 100, which is taken along line A-A of FIG. 2.

FIG. 1 is a diagram illustrating an example of the configuration of a semiconductor device 100 according to a first embodiment. FIG. 2 is a top plan view illustrating an example of the semiconductor device 100 illustrated in FIG. 1 when viewed from the top thereof. FIG. 3 is a sectional view illustrating an example of the section of the semiconductor device 100, which is taken along line A-A of FIG. 2. For the purpose of simplification, in FIG. 2, a first rewiring area 3 is not illustrated.

As illustrated in FIGS. 1 to 3, the semiconductor device 100 includes a large scale integration (LSI) board 1 having a substantially rectangular shape, a first rewiring area (rewiring layer) 3 having a substantially rectangular shape, and a plurality of ball electrodes (bumps) 2a to 2c.

The LSI chip 1 is provided with a semiconductor integrated circuit (not illustrated) formed thereon. The LSI chip 1 includes a semiconductor substrate (for example, a silicon substrate) 1a1 having a substantially rectangular shape, a second rewiring area (rewiring layer) 1a2, an LSI core 1a3, an outer peripheral pad area 1a4, an insulation film (insulation layer) 1b, and a plurality of pad electrodes 4a (4a1 to 4a3) and 4c (4c1 to 4c3).

The plurality of pad electrodes 4a (4a1 to 4a3) and 4c (4c1 to 4c3) are provided on the upper surface of the LSI chip 1. The plurality of pad electrodes 4a (4a1 to 4a3) and 4c (4c1 to 4c3), for example, is connected to the semiconductor integrated circuit (not illustrated), the LSI core 1a3, and the like. Furthermore, the pad electrodes 4a and 4c, for example, are connected to the ball electrodes 2a to 2c through rewiring patterns (not illustrated).

Furthermore, the insulation film 1b is provided on the upper surface of the LSI chip 1 to cover the semiconductor integrated circuit, and the plurality of pad electrodes 4a (4a1 to 4a3) and 4c (4c1 to 4c3).

The LSI core 1a3 is provided at the center portion of the semiconductor substrate 1a1. The LSI core 1a3 is provided, at the end of the upper surface thereof, with first pad electrodes 4c1 to 4c3 among the plurality of pad electrodes 4a (4a1 to 4a3) and 4c (4c1 to 4c3).

The LSI core 1a3, for example, is an LSI core such as an intellectual property (IP) core. The LSI core 1a3 is a multi-layered wiring layer of the semiconductor substrate (the silicon substrate) 1a1.

For example, as illustrated in FIG. 3, the first pad electrode 4c1 is connected to the first ball electrode 2c (positioned at the upper side) out of the plurality of ball electrodes, through one (a first contact wiring 7c) of a plurality of first contact wirings. In addition, the first contact wiring 7c may be removed as necessary.

In addition, the pad electrodes 4c1 to 4c3 provided on the LSI core 1a3 may also be removed as necessary. In the case of removing the pad electrodes 4c1 to 4c3, a rewiring layer of a second rewiring area, which will be described later, is electrically connected to the LSI core 1a3 without using a pad electrode.

Furthermore, the second rewiring area 1a2 is provided adjacent to the LSI core 1a3 on the semiconductor substrate 1a1 to surround the LSI core 1a3.

The second rewiring area 1a2 is provided with wiring layers 6b1 to 6b3 which connect the first pad electrodes 4c1 to 4c3 to the second pad electrodes 4a1 to 4a3, respectively. The wiring layers 6b1 to 6b3 include a plurality of layers, respectively. Furthermore, the wiring layers 6b1 to 6b3, for example, correspond to any one of a signal wiring, a power wiring, and a ground wiring.

In addition, for example, as illustrated in FIG. 3, the second rewiring area 1a2 is provided with a second contact wiring 9b1 connected to the first pad electrode 4c1, the wiring layer 6b1 connected to the second contact wiring 9b1, and a third contact wiring 9b2 connected to the second pad electrode 4a1 of the plurality of pad electrodes and the wiring layer 6b1.

Furthermore, for example, the wiring layer 6b2 connected to the second pad electrode 4a2 through a third contact wiring 9b3 includes a plurality of layers. In this way, wiring resistance of the wiring layer 6b2 is reduced, so that IR drop and electromigration can be suppressed.

The outer peripheral pad area 1a4 is provided adjacent to the second rewiring area 1a2 on the outer periphery of the semiconductor substrate 1a1 to surround the second rewiring area 1a2.

In addition, on the outer peripheral pad area 1a4, the second pad electrodes 4a, 4a1, and 4a2 are arranged in a row along the side of the LSI chip 1, in parallel with the board surface of the LSI chip 1.

Furthermore, the first rewiring area 3 having a substantially rectangular shape is provided on the insulation film 1b of the LSI chip 1. The first rewiring area 3 includes polyimide films (resin films) 3a and 3b provided on the insulation film 1b, connection electrodes 5 for a flip chip, a plurality of first contact wirings (vias) 7a1, 7a2, and 7c, and rewirings 8b1 and 8b2. The first rewiring area 3 includes only one wiring layer.

For example, as illustrated in FIG. 3, the plurality of first contact wirings 7a1, 7a2, and 7c are connected to some (the pad electrodes 4a1, 4a2, and 4c1) of the plurality of pad electrodes 4a (4a1 to 4a3) and 4c (4c1 to 4c3), respectively.

Furthermore, the rewirings 8b1 and 8b2 are connected to the first contact wirings 7a1 and 7a2, respectively.

Furthermore, for example, the second pad electrode 4a1 is connected to the ball electrode 2b through the first contact wiring 7a1 and the rewiring 8b1, and the second pad electrode 4a2 is connected to the ball electrode 2b through the first contact wiring 7a2 and the rewiring 8b2. The plurality of ball electrodes 2b connected to the second pad electrodes 4a1 and 4a2 is positioned above the second rewiring area 1a2.

Connection electrodes 5 are connected to the lower portions of the ball electrodes (bumps) 2a to 2c. The connection electrode 5 provided between the ball electrode 2c and the contact wiring 7c allows the ball electrode 2c to be electrically connected to the first contact wiring 7c.

The plurality of ball electrodes 2a to 2c is arranged in a matrix on the first rewiring area 3, and an interval thereof, for example, is about 0.4 mm. However, the plurality of ball electrodes (bumps) 2a to 2c is not necessarily arranged in a matrix, and the interval may also be set as necessary.

As described above, the second rewiring area 1a2 is provided with the second contact wiring 9b1 connected to the first pad electrode 4c1, the wiring layer 6b1 connected to the second contact wiring 9b1, and the third contact wiring 9b2 connected to the second pad electrode 4a1 and the wiring layer 6b1, and is provided adjacent to the LSI core 1a3 on the semiconductor substrate 1a1.

In this way, the rewiring of the first rewiring area 3 can be reduced. Consequently, when forming the wiring of a WCSP, rewirings can be wired without an increase in the number of wiring layers.

In this way, the wiring in WCSP can be easily performed and the area of the LSI chip 1 can be reduced. That is, a yield per one wafer can be improved and the number of chips per one wafer can be further increased.

As described above, according to the semiconductor device of the first embodiment, the wiring of a rewiring layer can be easily performed with a decrease in chip size.

Second Embodiment

In a second embodiment, another configuration example of a semiconductor device capable of reducing a chip size and facilitating the wiring of a rewiring layer will be described. In addition, the general configuration of the semiconductor device according to the second embodiment is the same as that of the semiconductor device 100 illustrated in FIG. 1.

Figure 4:
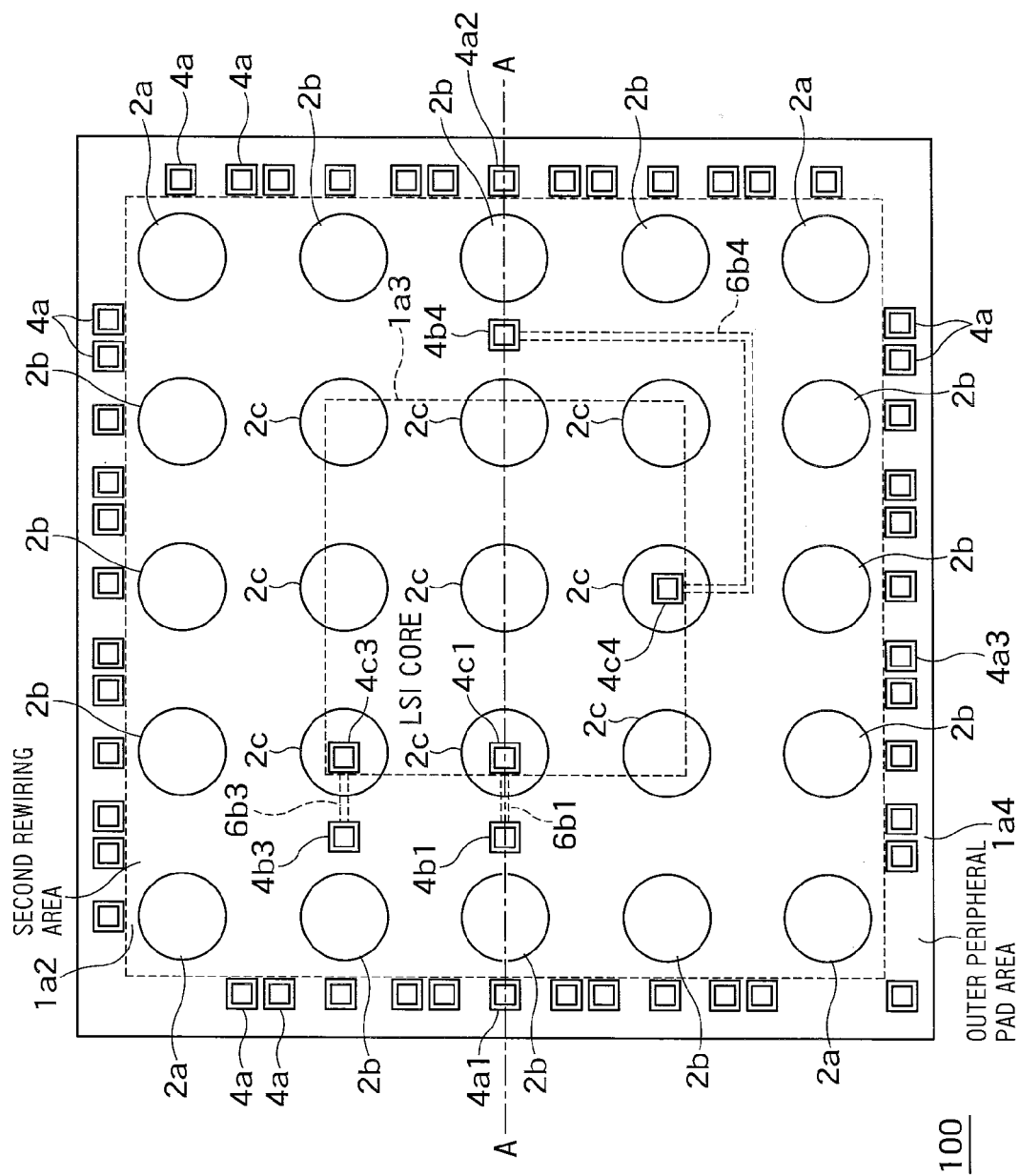
FIG. 4 is a top plan view illustrating another example of the semiconductor device 100 illustrated in FIG. 1 when viewed from the top thereof.
Figure 5:
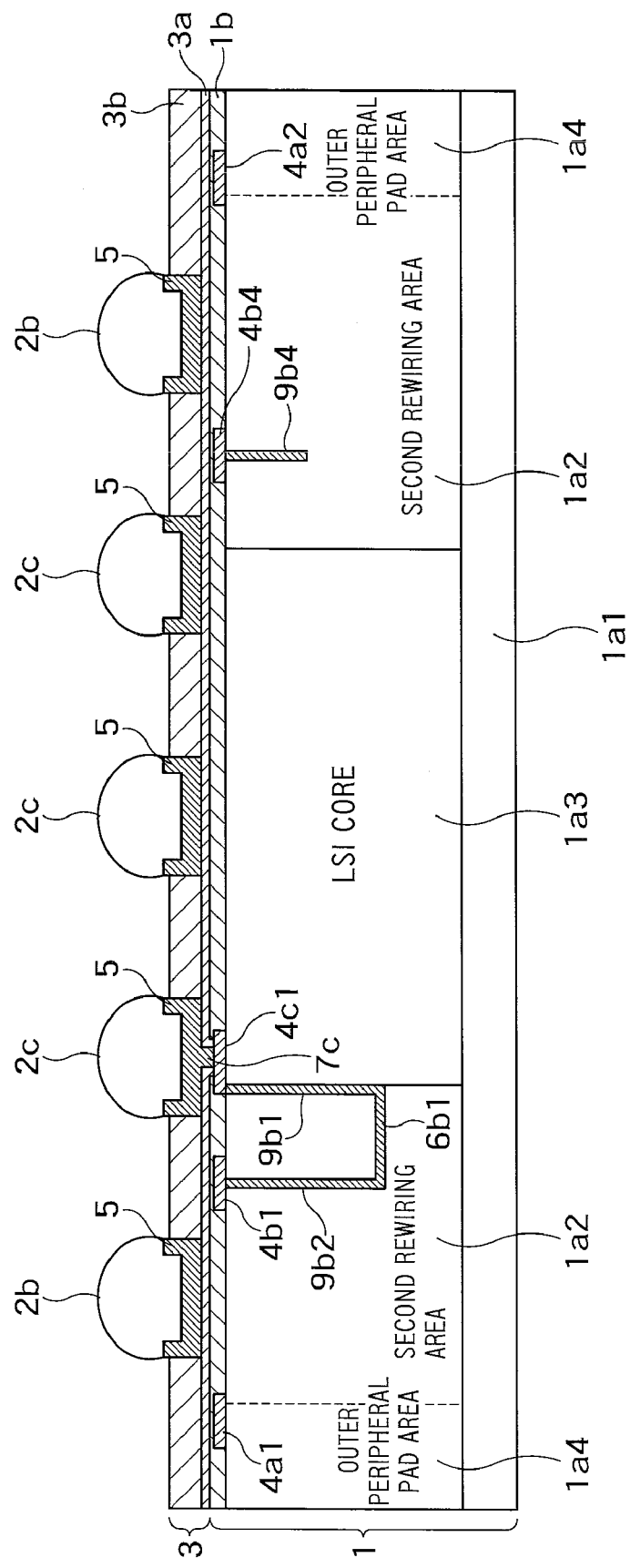
FIG. 5 is a sectional view illustrating an example of the section of the semiconductor device 100, which is taken along line A-A of FIG. 4.

FIG. 4 is a top plan view illustrating another example of the semiconductor device 100 illustrated in FIG. 1 when viewed from the top thereof. FIG. 5 is a sectional view illustrating an example of the section of the semiconductor device 100, which is taken along line A-A of FIG. 4. In FIGS. 4 and 5, the same reference numerals as those of the first embodiment illustrated in FIGS. 1 to 3 are used to designate the same elements as those of the first embodiment illustrated in FIGS. 1 to 3.

As illustrated in FIGS. 4 and 5, the semiconductor device 100 according to the second embodiment is substantially identical to that in the first embodiment, except that pad electrodes 4b1, 4b3, and 4b4 are provided on a second rewiring area 1a2 of an LSI chip 1.

That is, the second rewiring area 1a2 is provided with wiring layers 6b1, 6b3, and 6b4 which connect first pad electrodes 4c1, 4c3, and 4c4 to second pad electrodes 4b1, 4b3, and 4b4, respectively. The wiring layers 6b1, 6b3, and 6b4, for example, correspond to any one of a signal wiring, a power wiring, and a ground wiring.

In addition, for example, as illustrated in FIG. 5, the second rewiring area 1a2 is provided with a second contact wiring 9b1 connected to the first pad electrode 4c1, the wiring layer 6b1 connected to the second contact wiring 9b1, and a third contact wiring 9b2 connected to the second pad electrode 4b1 of the plurality of pad electrodes and the wiring layer 6b1.

Furthermore, the wiring layer 6b4 is connected to the second pad electrode 4b4 through a third contact wiring 9b4.

As described above, the second rewiring area 1a2 is provided with the second contact wiring 9b1 connected to the first pad electrode 4c1, the wiring layer 6b1 connected to the second contact wiring 9b1, and the third contact wiring 9b2 connected to the second pad electrode 4a1 and the wiring layer 6b1, and is provided adjacent to the LSI core 1a3 on the semiconductor substrate 1a1.

In this way, similarly to the first embodiment, the rewiring of the first rewiring area 3 can be reduced. Consequently, when forming the rewiring of a WCSP, rewirings can be wired without an increase in the number of wiring layers.

In this way, similarly to the first embodiment, the wiring in WCSP can be easily performed and the area of the LSI chip 1 can be reduced. That is, a yield per one wafer can be improved and the number of chips per one wafer can be further increased.

As described above, according to the semiconductor device of the second embodiment, the wiring of a rewiring layer can be easily performed with a decrease in chip size, similarly to the first embodiment.

Third Embodiment

In a third embodiment, a configuration example of a semiconductor device capable of reducing a chip size and facilitating the wiring of a rewiring layer while improving the characteristics of a power supply/grounding by disposing a wiring layer for a power supply or grounding in a second rewiring area and an LSI core will be described. In addition, the general configuration of the semiconductor device of the third embodiment is the same as that of the semiconductor device 100 illustrated in FIG. 1

Figure 6:
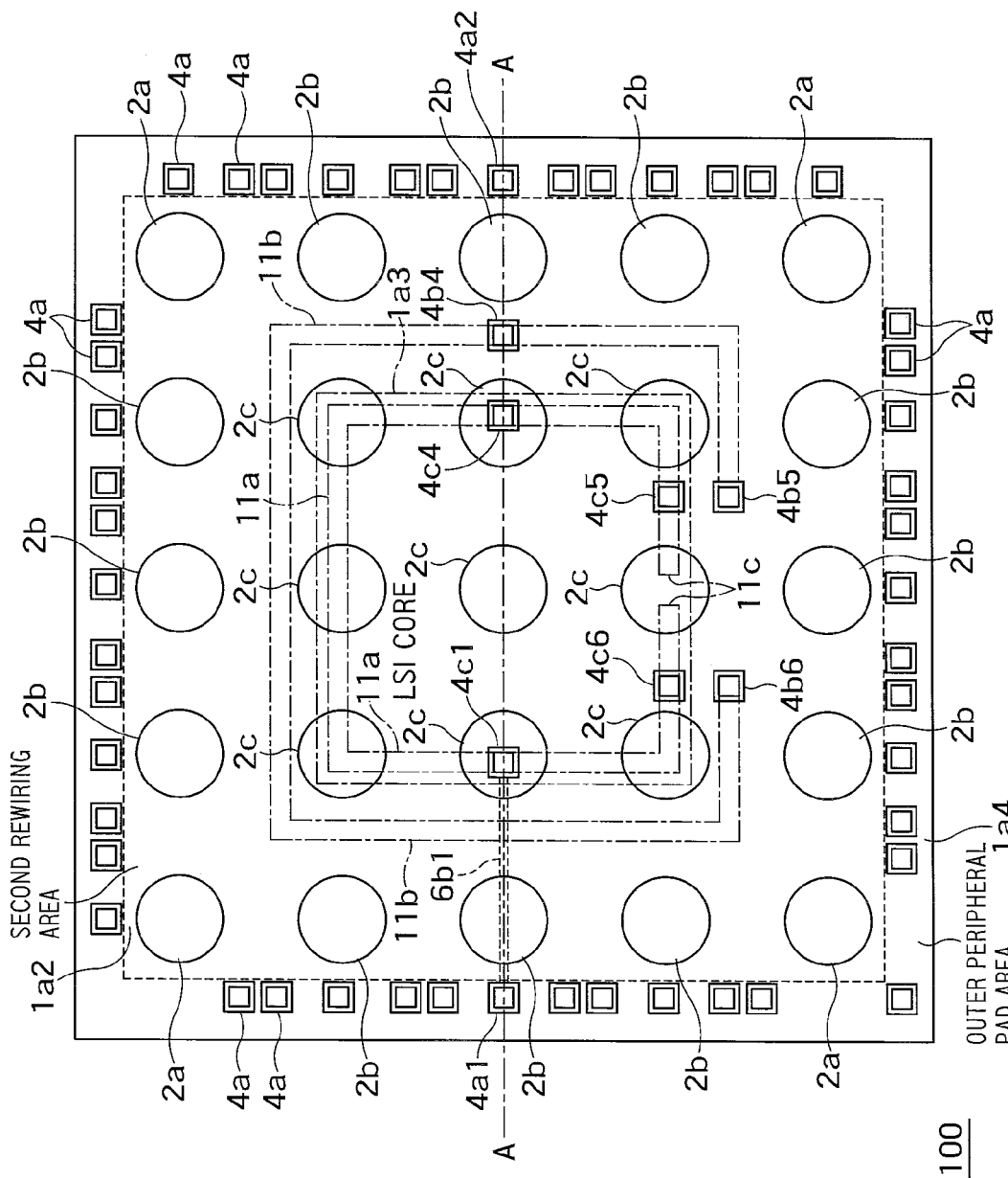
FIG. 6 is a top plan view illustrating another example of the semiconductor device 100 illustrated in FIG. 1 when viewed from the top thereof.
Figure 7:
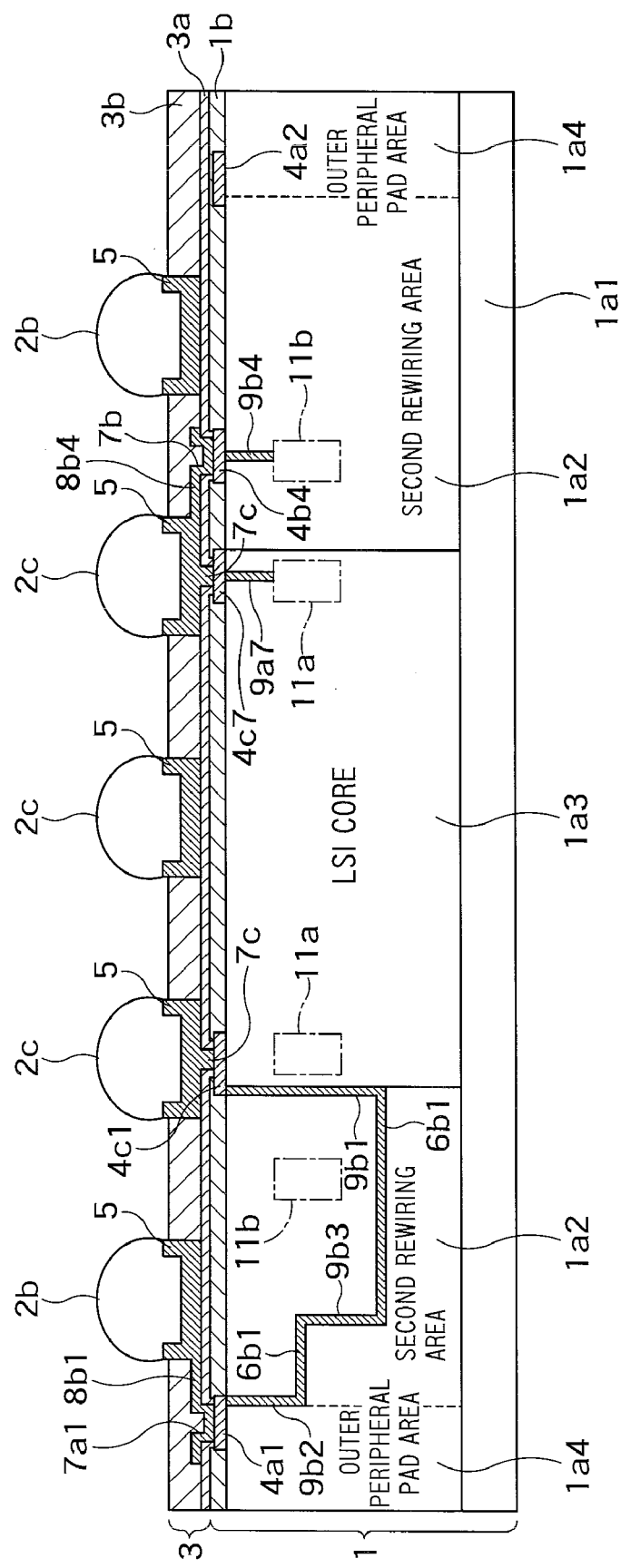
FIG. 7 is a sectional view illustrating an example of the section of the semiconductor device 100, which is taken along line A-A of FIG. 6.

FIG. 6 is a top plan view illustrating another example of the semiconductor device 100 illustrated in FIG. 1 when viewed from the top thereof. FIG. 7 is a sectional view illustrating an example of the section of the semiconductor device 100, which is taken along line A-A of FIG. 6. In FIGS. 6 and 7, the same reference numerals are used to designate the same elements as those of the first embodiment illustrated in FIGS. 1 to 3. Furthermore, a voltage wiring layer 11a for a power supply or grounding, which is disposed in an LSI core 1a3 illustrated in FIGS. 6 and 7, is not illustrated in the first and second embodiments. However, the voltage wiring layer 11a is also included in the first and second embodiments.

As illustrated in FIGS. 6 and 7, the semiconductor device 100 according to the third embodiment is substantially identical to that in the first embodiment, except that a voltage wiring layer 11b for a power supply or grounding is disposed in a second rewiring area 1a2.

The LSI core 1a3 includes the first voltage wiring layer 11a formed in the LSI core 1a3 along the outer periphery of the LSI core 1a3. The first voltage wiring layer 11a is connected to a first pad electrode 4c7 through a contact wiring 9a7 and configured to receive a first voltage (a power supply voltage or a ground voltage) applied thereto.

Furthermore, the second rewiring area 1a2 includes the second voltage wiring layer 11b formed along the outer periphery of the LSI core 1a3. The second voltage wiring layer 11b is electrically connected to the first voltage wiring layer 11a through a contact wiring 9b4, a pad electrode 4b4, a first contact wiring 7b, a rewiring 8b4, a first contact wiring 7c, a first pad electrode 4c7, and a contact wiring 9a7. In the same way, a pad electrode 4c6 is electrically connected to a pad electrode 4b6, and a pad electrode 4c5 is electrically connected to a pad electrode 4b5.

In addition, since the voltage wiring layer 11a has an end portion 11c, it is possible to reduce the influence of noise included in a power supply voltage (or a ground voltage), as compared with a ring-shaped connection.

As described above, in the third embodiment, the first and second voltage wiring layers 11a and 11b for a power supply or grounding are disposed in the second rewiring area 1a2 and the LSI core 1a3, resulting in the improvement of the characteristics of a power supply/grounding.

In addition, similarly to the first embodiment, the second rewiring area 1a2 is provided with a second contact wiring 9b1 connected to a first pad electrode 4c1, a wiring layer 6b1 connected to the second contact wiring 9b1, a contact wiring 9b3 for relaying a connection between two wiring layers 6b1, and a third contact wiring 9b2 connected to the second pad electrode 4a1 and the wiring layer 6b1. In addition, the second rewiring area 1a2 is provided adjacent to the LSI core 1a3 on the semiconductor substrate 1a1.

In this way, similarly to the first embodiment, the rewiring of the first rewiring area 3 can be reduced. Consequently, when forming the rewiring of a WCSP, rewirings can be wired without an increase in the number of wiring layers.

In this way, similarly to the first embodiment, the wiring in the WCSP can be easily performed and the area of the LSI chip 1 can be reduced. That is, a yield per one wafer can be improved and the number of chips per one wafer can be further increased.

As described above, according to the semiconductor device of the third embodiment, the wiring of a rewiring layer can be easily performed while reducing a chip size, similarly to the first embodiment.

Fourth Embodiment

In a fourth embodiment, described is a configuration example of a semiconductor device capable of reducing a chip size and facilitating the wiring of a rewiring layer while improving the characteristics of a power supply/grounding by disposing a wiring layer for a power supply or grounding in a second rewiring area and an LSI core. In addition, the general configuration of the semiconductor device according to the fourth embodiment is the same as that of the semiconductor device 100 illustrated in FIG. 1.

Figure 8:
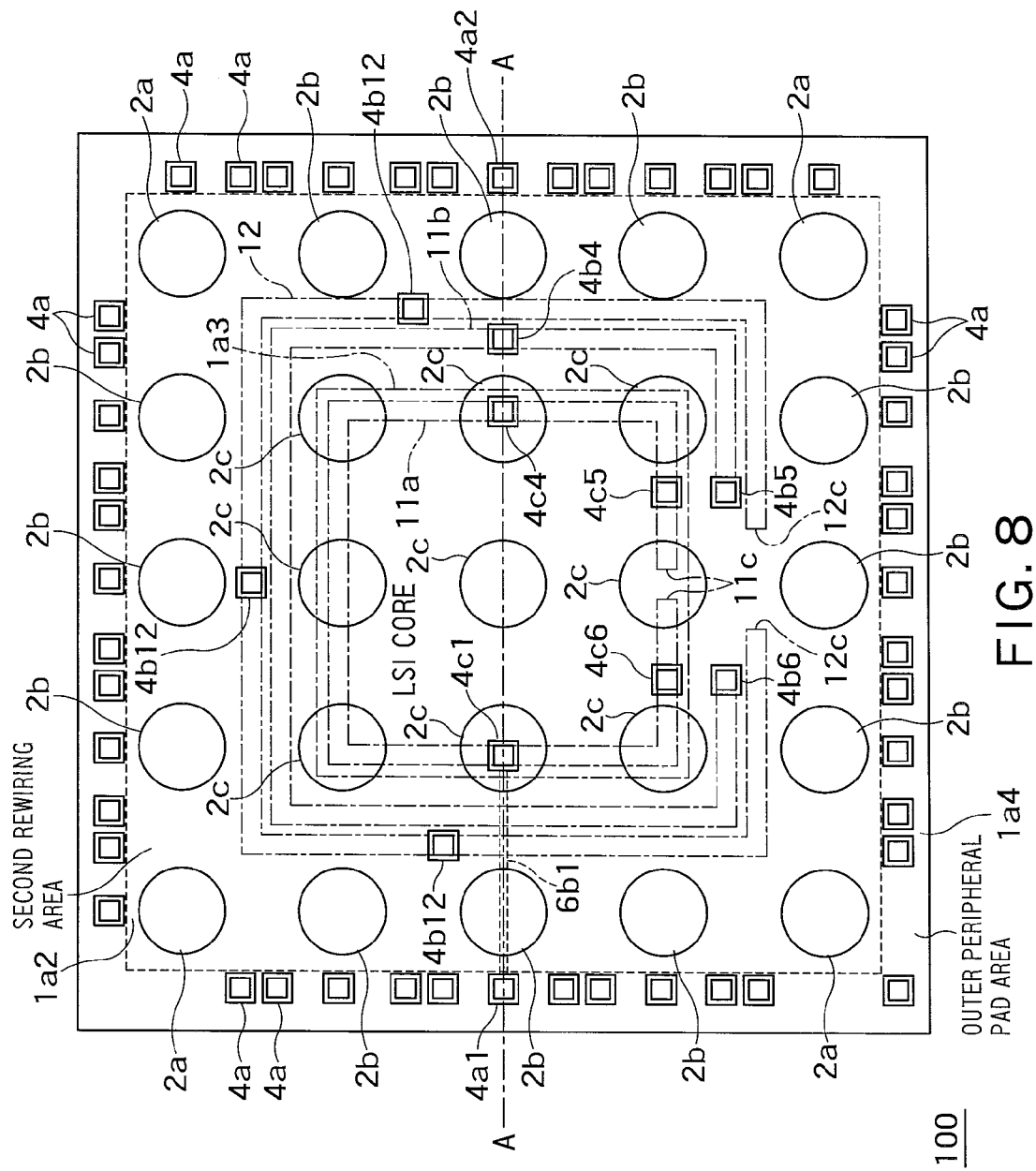
FIG. 8 is a top plan view illustrating another example of the semiconductor device 100 illustrated in FIG. 1 when viewed from the top thereof.
Figure 9:
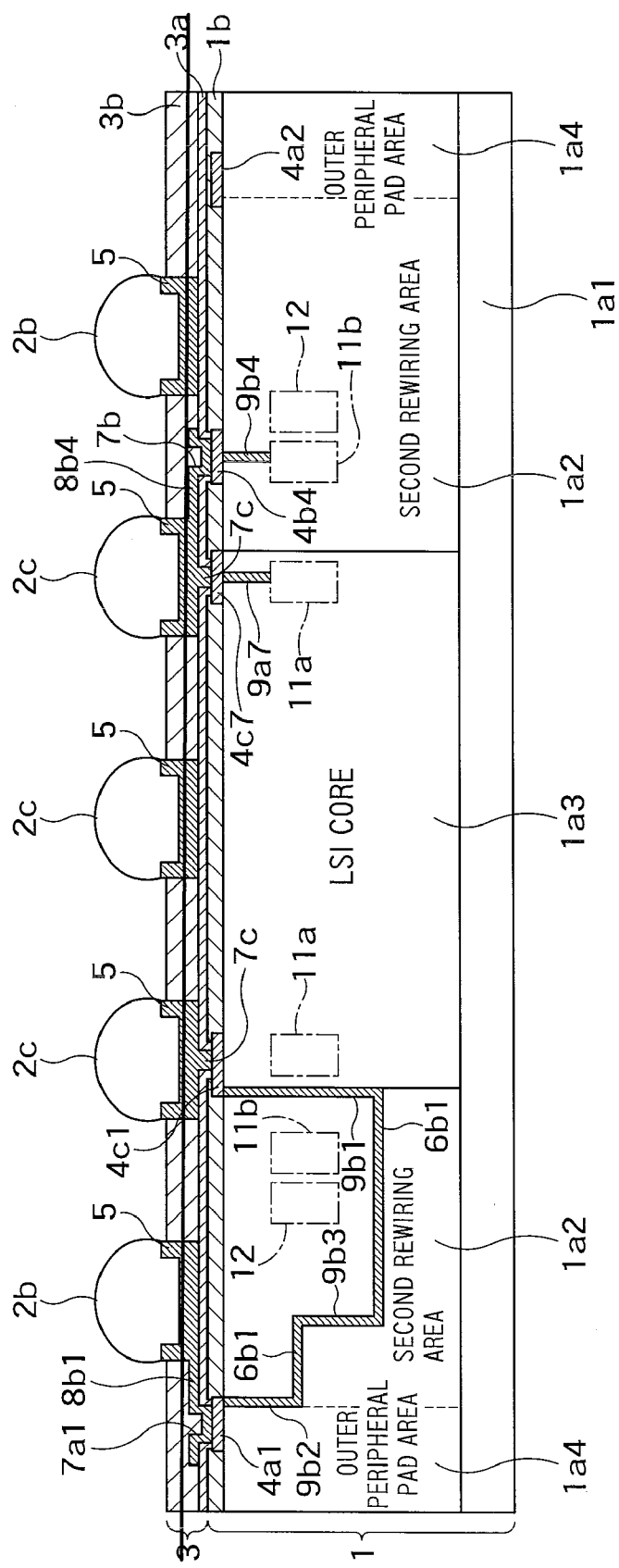
FIG. 9 is a sectional view illustrating an example of the section of the semiconductor device 100, which is taken along line A-A of FIG. 8.

FIG. 8 is a top plan view illustrating another example of the semiconductor device 100 illustrated in FIG. 1 when viewed from the top thereof. FIG. 9 is a sectional view illustrating an example of the section of the semiconductor device 100, which is taken along line A-A of FIG. 8. In FIGS. 8 and 9, the same reference numerals as those in FIGS. 6 and 7 are used to designate the same elements as those of the third embodiment illustrated in FIGS. 6 and 7.

As illustrated in FIGS. 8 and 9, the semiconductor device 100 according to the fourth embodiment is substantially identical to that in the third embodiment, except that a voltage wiring layer 12 for a power supply or grounding is further disposed in a second rewiring area 1a2.

That is, the second rewiring area 1a2 is formed along the outer periphery of an LSI core 1a3 and further includes a third voltage wiring layer 12 which receives a second voltage applied thereto. In addition, when a first voltage (any one of a power supply voltage and a ground voltage) is applied to first and second voltage wiring layers 11a and 11b, the second voltage is a remaining one of the power supply voltage and the ground voltage.

The third voltage wiring layer 12 is electrically connected to a ball electrode, to which the power supply voltage or the ground voltage is applied, through a pad electrode 4b12.

In addition, since the voltage wiring layer 12 has an end portion 12c, it is possible to reduce the influence of noise included in the power supply voltage (or the ground voltage), as compared with a ring-shaped connection.

As described above, in the fourth embodiment, the first and second voltage wiring layers 11a and 11b for a power supply or grounding are disposed in the second rewiring area 1a2 and the LSI core 1a3, and the third voltage wiring layer 12 for a power supply or grounding is further disposed in the second rewiring area 1a2, resulting in the improvement of the characteristics of a power supply/grounding.

In addition, similarly to the first embodiment, the second rewiring area 1a2 is provided with a second contact wiring 9b1 connected to a first pad electrode 4c1, a wiring layer 6b1 connected to the second contact wiring 9b1, a contact wiring 9b3 for relaying a connection between two wiring layers 6b1, and a third contact wiring 9b2 connected to the second pad electrode 4a1 and the wiring layer 6b1. In addition, the second rewiring area 1a2 is provided adjacent to the LSI core 1a3 on the semiconductor substrate 1a1.

In this way, similarly to the third embodiment, the rewiring of the first rewiring area 3 can be reduced. Consequently, when forming the rewiring of a WCSP, rewirings can be wired without an increase in the number of wiring layers.

In this way, similarly to the third embodiment, the wiring in the WCSP can be easily performed and the area of an LSI chip 1 can be reduced. That is, a yield per one wafer can be improved and the number of chips per one wafer can be further increased.

Figure 10:
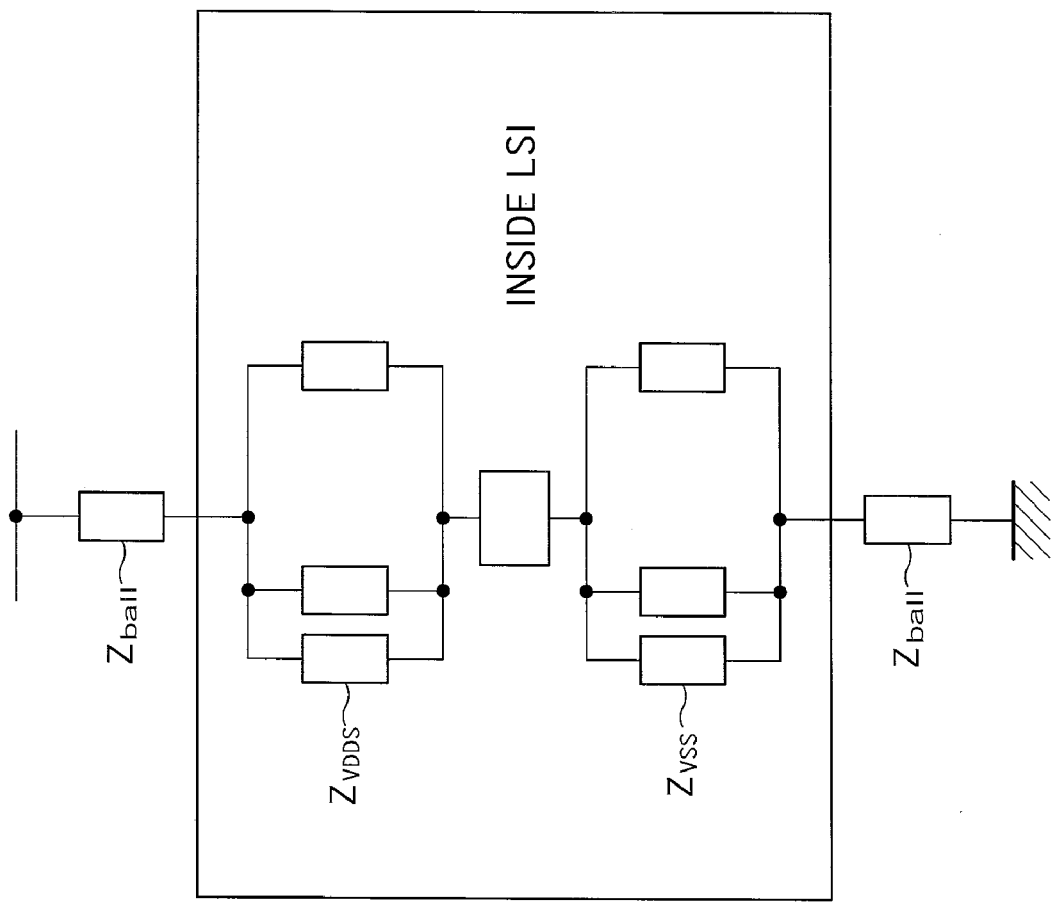
FIG. 10 is a model for explaining the impedance of a wiring for a power supply/grounding when viewed from the LSI of the semiconductor device 100 illustrated in FIG. 8.

Here, FIG. 10 is a model for explaining the impedance of a wiring for a power supply/grounding when viewed from the LSI of the semiconductor device 100 illustrated in FIG. 8. In FIG. 10, $Z_{VDDS}$ denotes the impedances of the first and second voltage wiring layers 11a and 11b, $Z_{VSS}$ denotes the impedance of the third voltage wiring layer 12, and $Z_{ball}$ denotes the impedance of the ball electrode.

As illustrated in FIG. 10, the impedances $Z_{VDDS}$ of the first and second voltage wiring layers 11a and 11b are reduced by allowing a plurality of first voltage wiring layers 11a and a plurality of second voltage wiring layers 11b to be connected in parallel to each other, respectively. The impedance $Z_{VSS}$ of the third voltage wiring layer 12 is reduced by allowing a plurality of third voltage wiring layers 12 to be connected in parallel to each other. In this way, IR drop, electromigration, noise and the like are reduced. That is, a resistance value inside the LSI of the LSI chip 1 is reduced.

As described above, according to the semiconductor device according to the fourth embodiment, the wiring of a rewiring layer can be easily performed while reducing a chip size, similarly to the third embodiment.

Fifth Embodiment

In a fifth embodiment, a configuration example of a semiconductor device capable of facilitating the wiring of a rewiring layer while reducing a chip size by setting a connection relationship of a second rewiring area using a program element for a field programmable gate array (FPGA) will be described. In addition, the general configuration of the semiconductor device according to the fifth embodiment is the same as that of the semiconductor device 100 illustrated in FIG. 1.

Figure 11:
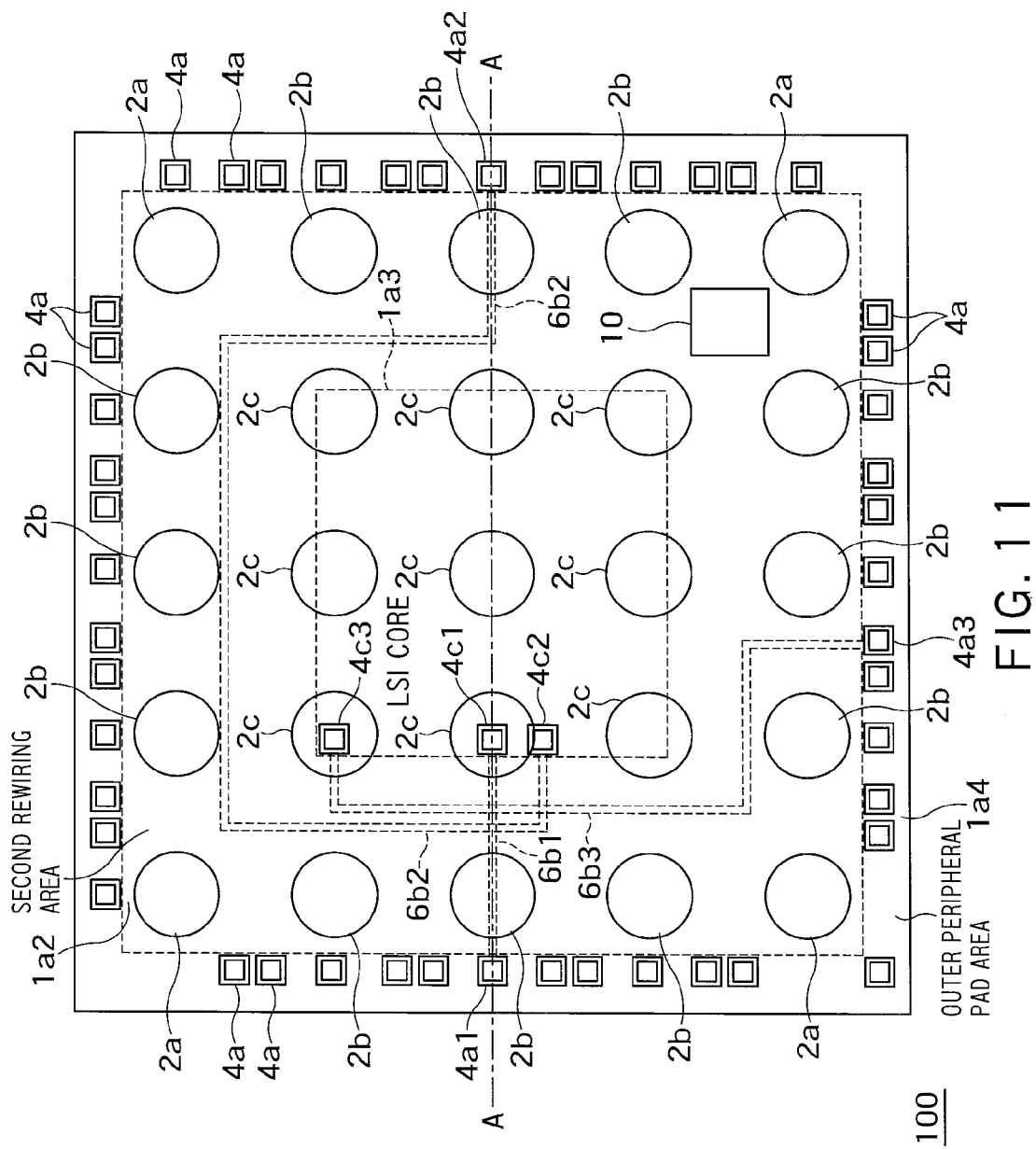
FIG. 11 is a plan view illustrating another example of the semiconductor device 100 illustrated in FIG. 1 when viewed from the top thereof.

FIG. 11 is a plan view illustrating another example of the semiconductor device 100 illustrated in FIG. 1 when viewed from the top thereof. In FIG. 11, the same reference numerals are used to designate the same elements as those of the first embodiment illustrated in FIG. 2. The section of the semiconductor device 100, which is taken along line A-A of FIG. 11, is the same as that of FIG. 3.

As illustrated in FIG. 11, the semiconductor device 100 according to the fifth embodiment is substantially identical to that in the first embodiment, except for a program element 10 for an FPGA.

Here, an FPGA is applied to a second rewiring area 1a2, and the connection relationship among wiring layers 6b1 to 6b3, a second contact wiring 9b1, and a third contact wiring 9b2 can be changed by the setting of a wiring program (circuit information). The second rewiring area 1a2 includes the program element 10 which stores a wiring program for setting the connection relationship. In addition, the connection relationship may include the first to third voltage wiring layers and the like illustrated in FIGS. 8 and 9.

The program element 10 is disposed in the second rewiring area. The program element 10, for example, includes an NAND type flash memory, an SRAM, a FeRAM and the like.

The connection relationship of the second rewiring area 1a2 is set by the program element 10, so that the second rewiring area 1a2 includes a second contact wiring 9b1 connected to a first pad electrode 4c1, a wiring layer 6b1 connected to the second contact wiring 9b1, and a third contact wiring 9b2 connected to the second pad electrode 4a1 and the wiring layer 6b1, similarly to the first embodiment.

In this way, similarly to the first embodiment, the rewiring of a first rewiring area 3 can be reduced. Consequently, when forming the rewiring of a WCSP, rewirings can be wired without an increase in the number of wiring layers.

In this way, similarly to the first embodiment, the wiring in the WCSP can be easily performed and the area of the LSI chip 1 can be reduced. That is, a yield per one wafer can be improved and the number of chips per one wafer can be further increased.

In addition, since the connection relationship can be easily changed by changing the wiring program, mask refinement due to a connection error of the connection relationship is not necessary.

As described above, according to the semiconductor device according to the fifth embodiment, the wiring of a rewiring layer can be easily performed while reducing a chip size, similarly to the first embodiment.

Sixth Embodiment

In a sixth embodiment, a method of designing wirings of the semiconductor device 100 according to the first to fourth embodiments will be described.

Figure 12:
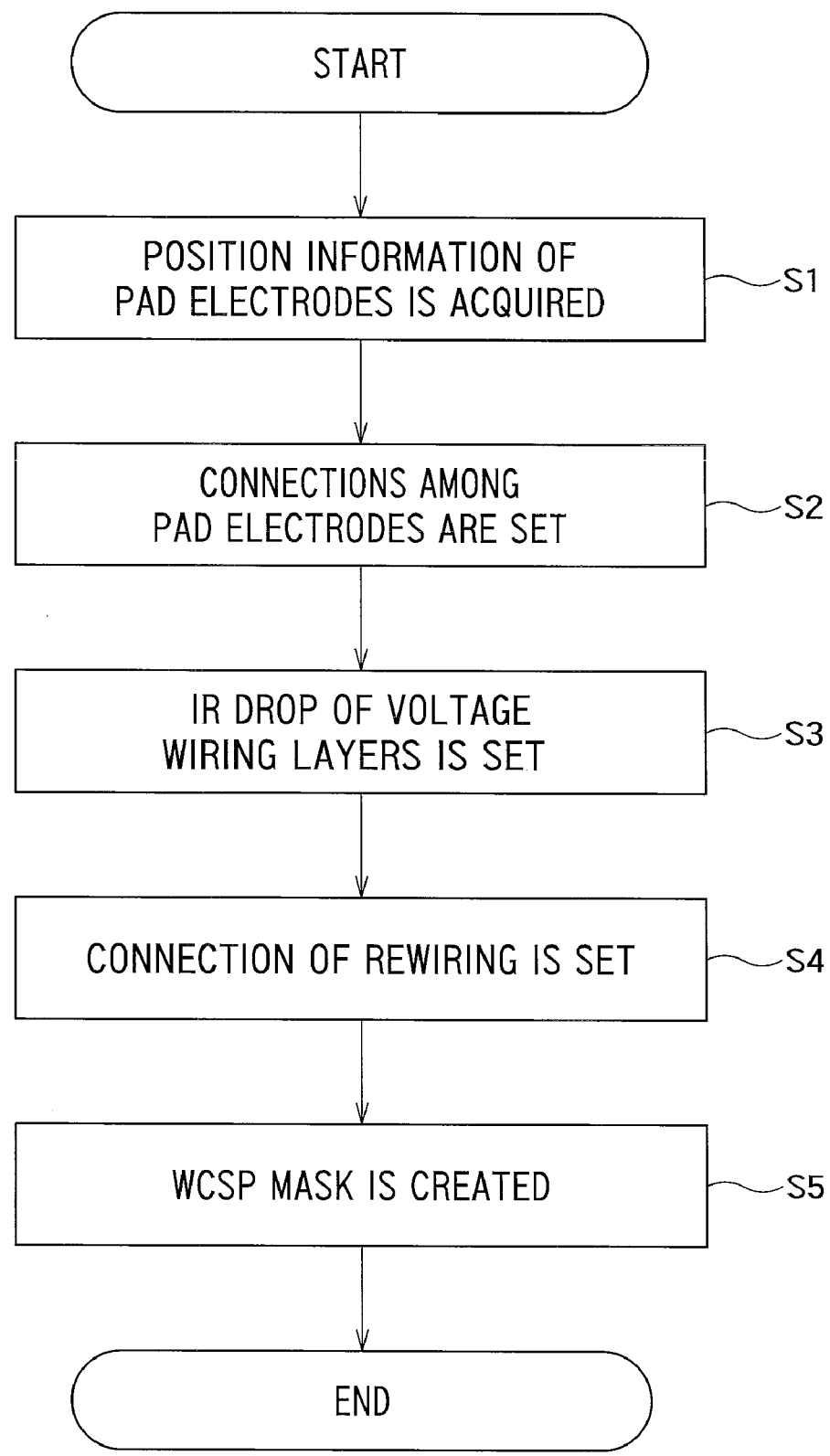
FIG. 12 is a diagram illustrating an example of the flow of the method of designing the wirings of the semiconductor device 100.

FIG. 12 is a diagram illustrating an example of the flow of the method of designing the wirings of the semiconductor device 100. Here, a case where the method is applied to the semiconductor device 100 according to the fourth embodiment will be described.

As illustrated in FIG. 12, first, position information of the first pad electrode 4c1, and position information of pad electrodes on the LSI core 1a3 including the second pad electrode 4a1, the second rewiring area 1a2, and the outer peripheral pad area 1a4 are acquired (step S1).

Next, connections among the pad electrodes in the second rewiring area 1a2 are set (step S2). For example, such as a connection between the first pad electrode 4c1 and the second pad electrode 4a1, that is, the connection relationship among the second contact wiring 9b1, the third contact wiring 9b2, and the wiring layer 6b1 is set.

Then, IR drop of the voltage wiring layers in the second rewiring area 1a2 is set (step S3). For example, line widths and the like of the first to third voltage wiring layers 11a, 11b, and 12 are determined according to the set IR drop.

Then, a connection of rewirings in the first rewiring area 3 is set. For example, a connection of the rewirings 8b1 and 8b4 is set (step S4).

Last, a WCSP mask is created on the basis of the connection relationship in the first rewiring area 3 and the second rewiring area 1a2 (step S5).

By the above flow, the WCSP mask for forming the semiconductor device 100 is created.

According to a semiconductor device manufactured using the WCSP mask, the wiring of a rewiring layer can be easily performed while reducing a chip size, similarly to the fourth embodiment.

Seventh Embodiment

In a seventh embodiment, a method of designing wirings for designing a wiring program for the program element 10 of the semiconductor device 100 according to the fifth embodiment will be described.

Figure 13:
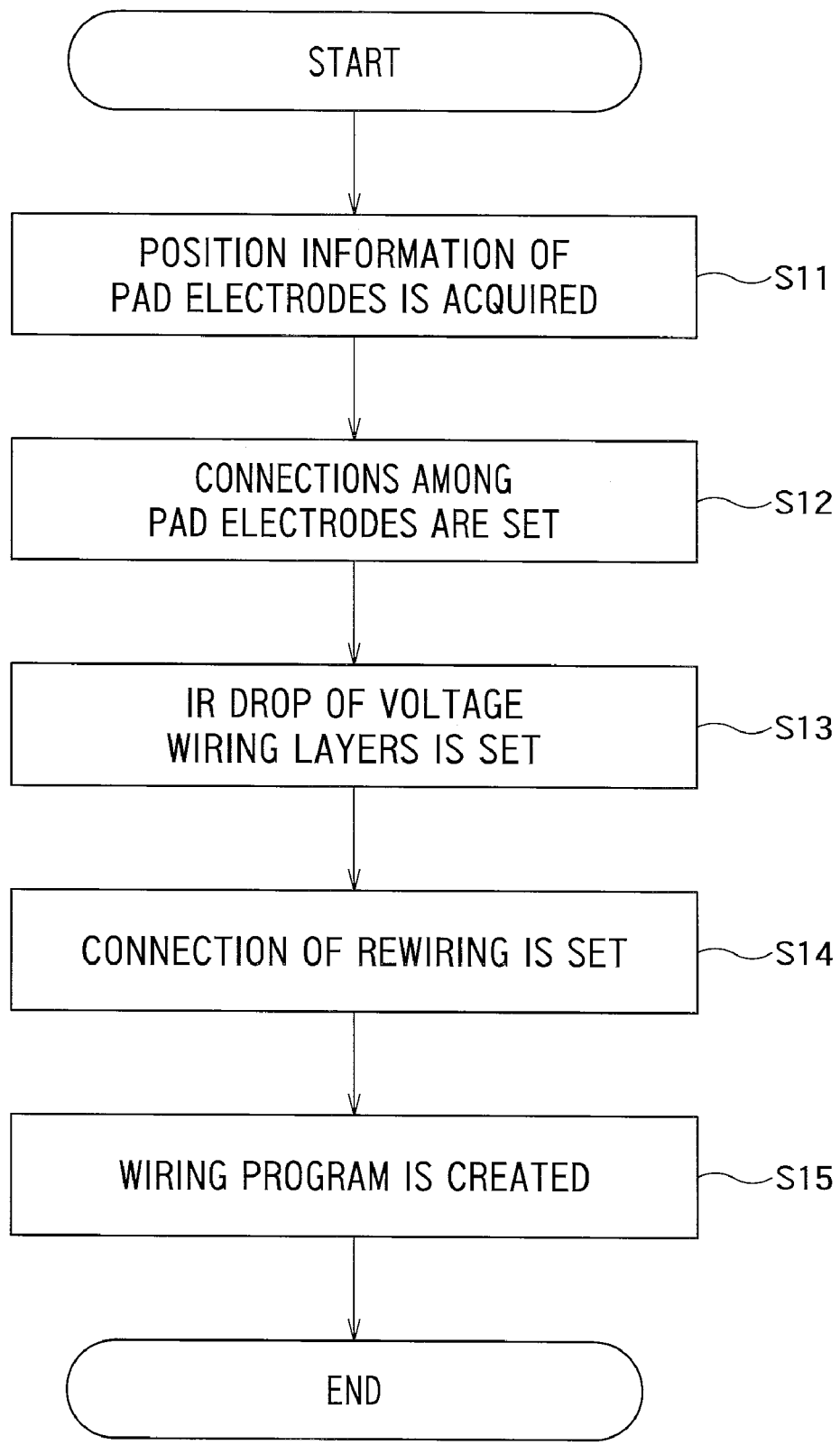
FIG. 13 is a diagram illustrating another example of the flow of the wiring design method of the semiconductor device 100.

FIG. 13 is a diagram illustrating another example of the flow of the wiring design method of the semiconductor device 100. Here, description is made with the case in which the wiring design method is applied to the semiconductor device 100 according to the fifth embodiment.

As illustrated in FIG. 13, first, position information of the first pad electrode 4c1, and position information of pad electrodes on the LSI core 1a3 including the second pad electrode 4a1, the second rewiring area 1a2, and the outer peripheral pad area 1a4 are acquired (step S11).

Next, connections among the pad electrodes in the second rewiring area 1a2 are set (step S12). For example, such as a connection between the first pad electrode 4c1 and the second pad electrode 4a1, that is, the connection relationship among the second contact wiring 9b1, the third contact wiring 9b2, and the wiring layer 6b1 is set.

Then, IR drop of the voltage wiring layers in the second rewiring area 1a2 is set (step S13). Although not illustrated in the semiconductor device 100 according to the fifth embodiment, in the case of the semiconductor device 100 according to the fourth embodiment, line widths and the like of the first to third voltage wiring layers 11a, 11b, and 12 are determined according to the set IR drop.

Then, a connection of rewirings in the first rewiring area 3 is set. For example, a connection of the rewirings 8b1 and 8b4 is set (step S14).

Last, a wiring program is created based on the connection relationship in the first rewiring area 3 and the second rewiring area 1a2 (step S15).

By the above flow, the wiring program for forming the semiconductor device 100 is created.

According to the semiconductor device 100 in which the connection relationship of the second rewiring area 1a2 is set by the program element 10 including the set wiring program, the wiring of a rewiring layer can be easily performed while reducing a chip size, similarly to the fifth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
    an LSI chip including a semiconductor substrate, an LSI core section provided at a center portion of the semiconductor substrate and serving as a multilayered wiring layer of the semiconductor substrate, a first rewiring layer provided adjacent to an outer periphery of the LSI core section on the semiconductor substrate and including a plurality of wiring layers, a first pad electrode disposed at an outer periphery of the first rewiring layer, and an insulation layer covering the first pad electrode;
    a second rewiring layer provided on the LSI chip and including a rewiring connected to the first pad electrode; and
    a plurality of ball electrodes provided on the second rewiring layer,
    wherein the first rewiring layer is electrically connected to the LSI core section and the first pad electrode.

2. The semiconductor device according to claim 1, wherein the first rewiring layer includes:
    a first rewiring wired in a first direction; and
    a second rewiring wired in a second direction,
    wherein the second rewiring is wired to make a detour around the first rewiring by the plurality of wiring layers.

3. The semiconductor device according to claim 1, wherein the first rewiring layer includes:
    a first contact wiring connected to the first pad electrode;
    a second contact wiring connected to a pad electrode formed on the LSI core section; and
    a wiring layer connected between the first contact wiring and the second contact wiring.

4. The semiconductor device according to claim 1, wherein the LSI chip includes:
    an outer peripheral pad layer provided adjacent to the outer periphery of the first rewiring layer on the semiconductor substrate,
    wherein the first pad electrode is provided on the outer peripheral pad layer.

5. The semiconductor device according to claim 1, wherein the second rewiring layer includes a contact wiring connecting the rewiring and the ball electrode.

6. The semiconductor device according to claim 1, further comprising:
    a second pad electrode which is provided on the LSI core section and which serves as an output terminal of the LSI core section,
    wherein the first rewiring layer connects the first pad electrode to the second pad electrode.

7. The semiconductor device according to claim 1, wherein the first rewiring layer includes:
    a first contact wiring connected to the first pad electrode;
    a second contact wiring connected to a pad electrode formed on the first rewiring layer; and
    a wiring layer connected between the first contact wiring and the second contact wiring.

8. The semiconductor device according to claim 1,
    wherein the LSI core includes a first voltage wiring layer, the first voltage wiring layer formed in the LSI core along the outer periphery of the LSI core, connected to the first pad electrode, and applied a first voltage thereto, and
    wherein the second rewiring layer includes a second voltage wiring layer, the second voltage wiring layer formed along the outer periphery of the LSI core and being electrically connected to the first voltage wiring layer.

9. The semiconductor device according to claim 8, wherein the second rewiring layer further includes a third voltage wiring layer, the second voltage wiring layer formed along the outer periphery of the LSI core and applied a second voltage thereto.

10. The semiconductor device according to claim 9, wherein the first voltage is any one of a power supply voltage and a ground voltage, and the second voltage is a remaining one of the power supply voltage and the ground voltage.

11. The semiconductor device according to claim 1, wherein, in the second rewiring layer, a connection relationship among the wiring layers can be changed, and the second rewiring layer includes a program element setting the connection relationship.

12. The semiconductor device according to claim 1, wherein the wiring layer is any one of a signal wiring, a power wiring, and a ground wiring.

* * * * *